(12) United States Patent
Yaginuma et al.

(10) Patent No.: US 9,627,655 B2
(45) Date of Patent: Apr. 18, 2017

(54) DISPLAY DEVICE AND METHOD FOR MANUFACTURING SAME

(71) Applicant: NITTO DENKO CORPORATION, Ibaraki-shi, Osaka (JP)

(72) Inventors: Hironori Yaginuma, Ibaraki (JP); Kentarou Takeda, Ibaraki (JP); Takashi Shimizu, Ibaraki (JP); Kazuki Uwada, Ibaraki (JP); Nao Murakami, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 14/417,243

(22) PCT Filed: Jul. 4, 2013

(86) PCT No.: PCT/JP2013/068325
§ 371 (c)(1),
(2) Date: Jan. 26, 2015

(87) PCT Pub. No.: WO2014/021048
PCT Pub. Date: Feb. 6, 2014

(65) Prior Publication Data
US 2015/0249231 A1    Sep. 3, 2015

(30) Foreign Application Priority Data
Jul. 31, 2012 (JP) .................. 2012-169763

(51) Int. Cl.
*H01L 51/52* (2006.01)
*H01L 51/56* (2006.01)
(Continued)

(52) U.S. Cl.
CPC ........ *H01L 51/5293* (2013.01); *G02B 5/3033* (2013.01); *G02B 5/3083* (2013.01);
(Continued)

(58) Field of Classification Search
CPC . H01L 2251/55; H01L 51/5293; H01L 27/32; H01L 51/56; H01L 51/5281; H01L 27/3276; G02B 5/3083; G02B 5/3033
(Continued)

(56) References Cited

U.S. PATENT DOCUMENTS 7,417,251 B2    8/2008  Iketsu et al.
7,615,924 B2   11/2009  Kaneko
(Continued)

FOREIGN PATENT DOCUMENTS

CN    101582441 A    11/2009
CN    102346334 A     2/2012
(Continued)

OTHER PUBLICATIONS

Translation of JP2011-070012A (Apr. 7, 2011) Mizuguchi (Sumitomo Chemical Co Ltd.), 14 pages.*
(Continued)

*Primary Examiner* — Caridad Everhart
(74) *Attorney, Agent, or Firm* — Westerman, Hattori, Daniels & Adrian, LLP (57) ABSTRACT

There is provided a display apparatus that can suppress the occurrence of a crack in a circularly polarizing plate in its manufacturing process without reducing designability and mass productivity. A display apparatus according to an embodiment of the present invention includes: a display element; and a circularly polarizing plate placed on a viewer side of the display element. The circularly polarizing plate includes a polarizer and a retardation film. In-plane retardations of the retardation film satisfy a relationship represented by the below-indicated expression (1); and an angle θ1 formed between a slow axis of the retardation film and a direction in which a wiring crimping portion provided along at least one side of a peripheral edge portion of the display
(Continued)

element extends satisfies a relationship represented by the below-indicated expression (2):

$$Re(450) < Re(550) \quad (1)$$

$$\theta_1 \leq 70° \quad (2)$$

where Re(450) and Re(550) represent in-plane retardations measured at 23° C., and at wavelengths of 450 nm and 550 nm, respectively.

6 Claims, 3 Drawing Sheets

(51) Int. Cl.
  *H01L 27/32* (2006.01)
  *G02B 5/30* (2006.01)
  *H04M 1/02* (2006.01)

(52) U.S. Cl.
  CPC .......... *H01L 27/32* (2013.01); *H01L 27/3276* (2013.01); *H01L 51/5281* (2013.01); *H01L 51/56* (2013.01); H01L 2251/55 (2013.01); H04M 1/0266 (2013.01)

(58) Field of Classification Search
  USPC .......................................................... 257/87
  See application file for complete search history.

(56) References Cited

U.S. PATENT DOCUMENTS

| | | | |
|---|---|---|---|
| 7,785,942 B2 | 8/2010 | Iketsu et al. | |
| 7,939,998 B2 | 5/2011 | Yamashita et al. | |
| 7,973,749 B2 | 7/2011 | Uehara et al. | |
| 8,687,155 B2 | 4/2014 | Mitsumoto et al. | |
| 2003/0215582 A1* | 11/2003 | Bermel | B29C 41/12 428/1.31 |
| 2005/0168669 A1* | 8/2005 | Nakamura | G02B 5/3083 349/96 |
| 2005/0247939 A1 | 11/2005 | Iketsu et al. | |
| 2007/0176887 A1* | 8/2007 | Uehara | G02F 1/1323 345/102 |
| 2007/0216298 A1 | 9/2007 | Kaneko | |
| 2009/0053862 A1 | 2/2009 | Iketsu et al. | |
| 2009/0128747 A1* | 5/2009 | Sugiyama | B29C 55/06 349/96 |
| 2009/0284147 A1 | 11/2009 | Yamashita et al. | |
| 2010/0007259 A1 | 1/2010 | Kaneko | |
| 2010/0290117 A1* | 11/2010 | Diehl | G02B 5/3083 359/489.2 |
| 2010/0296037 A1* | 11/2010 | Sakai | G02F 1/133634 349/119 |
| 2011/0090439 A1* | 4/2011 | Nakamura | G02B 5/3016 349/117 |
| 2012/0019753 A1 | 1/2012 | Mitsumoto et al. | |
| 2012/0147300 A1* | 6/2012 | Fukuda | G02B 5/3083 349/96 |

FOREIGN PATENT DOCUMENTS

| | | | | |
|---|---|---|---|---|
| JP | 09-127885 A | | 5/1997 | |
| JP | 2004-063085 A | | 2/2004 | |
| JP | 2007-016102 A | | 1/2007 | |
| JP | 2007-233373 A | | 9/2007 | |
| JP | 2007-265968 A | | 10/2007 | |
| JP | 2007-290342 A | | 11/2007 | |
| JP | 2008-078038 A | | 4/2008 | |
| JP | 2009-301013 A | | 12/2009 | |
| JP | 2011-070012 A | | 4/2011 | |
| JP | 2011070012 A | * | 4/2011 | ............ H01L 51/50 |
| JP | 2012-068674 A | | 4/2012 | |
| WO | 2013/065587 A1 | | 5/2013 | |

OTHER PUBLICATIONS

International Search Report dated Aug. 6, 2013, issued in corresponding application No. PCT/JP2013/068325.
Office Action dated Feb. 1, 2016, issued in counterpart Chinese Patent Application No. 201380040644.7, with English translation. (15 pages).
Office Action dated Sep. 30, 2016, issued in counterpart Korean Patent Application No. 10-2015-7002665, with English translation. (15 pages).
Third Party Observation dated Oct. 14, 2016, issued in counterpart Japanese Patent Application No. 2012-169763, with English translation. (39 pages).

* cited by examiner

DISPLAY DEVICE AND METHOD FOR MANUFACTURING SAME

TECHNICAL FIELD

The present invention relates to a display apparatus and a method of manufacturing the apparatus.

BACKGROUND ART

The number of opportunities for the use of a display apparatus for, for example, a smart device typified by a smart phone, digital signage, or a window display under strong ambient light has been increasing in recent years. In association with the increase, there has been occurring a problem such as: the reflection of the ambient light by the display apparatus itself or a reflector to be used in the display apparatus such as a touch panel portion, a glass substrate, or a metal wiring; or the reflection of a background on the display apparatus or the reflector. In particular, an organic EL panel that has started to be put into practical use in recent years is liable to cause a problem such as the reflection of the ambient light or the reflection of the background because the panel has a metal layer having high reflectivity. In view of the foregoing, it has been known that such problem is prevented by providing a circularly polarizing plate including a retardation film (typically a λ/4 plate) on a viewer side.

Meanwhile, when the display element (e.g., organic EL panel) of the display apparatus is connected to a drive circuit substrate, the following needs to be performed. A flexible cable is crimped onto the display element under a high temperature and a high pressure, and then a burnt deposit and/or dirt are/is wiped off and washed with a solvent. In ordinary cases, a crimping portion is provided in the non-display portion of the display element, and is designed so that influences of heat and the solvent on the display portion thereof may be small. In recent years, however, there has been a growing demand for the narrowing of the non-display portion in association with an improvement in technology and the growth of a requirement for design, and hence it has started to become impossible to sufficiently secure a distance (clearance) between the crimping portion and the display portion. As a result, the following problem has been occurring. The circularly polarizing plate bonded to the display portion is influenced by the heat and/or the solvent, and hence a crack occurs in the retardation film. To cope with the problem, there has been proposed an approach involving changing the physical properties of a pressure-sensitive adhesive to be used in the polarizing plate to alleviate a stress due to the expansion and shrinkage of a retardation plate or a polarizer (see Patent Literature 1). However, such approach cannot necessarily buffer intensive influences by the heat and/or the solvent on an end portion of the polarizing plate.

CITATION LIST

Patent Literature

[PTL 1] JP 2012-068674 A

SUMMARY OF INVENTION

Technical Problem

The present invention has been made to solve the above-mentioned problems, and an object of the present invention is to provide a display apparatus that can suppress the occurrence of a crack in a circularly polarizing plate in its manufacturing process without reducing designability and mass productivity, and a method of manufacturing the apparatus.

Solution to Problem

A display apparatus according to an embodiment of the present invention includes: a display element; and a circularly polarizing plate placed on a viewer side of the display element. The circularly polarizing plate includes a polarizer and a retardation film. In-plane retardations of the retardation film satisfy a relationship represented by the below-indicated expression (1); and an angle θ1 formed between a slow axis of the retardation film and a direction in which a wiring crimping portion provided along at least one side of a peripheral edge portion of the display element extends satisfies a relationship represented by the below-indicated expression (2):

$$Re(450) < Re(550) \tag{1}$$

$$\theta1 \leq 70° \tag{2}$$

Where Re(450) and Re(550) represent in-plane retardations measured at 23° C., and at wavelengths of 450 nm and 550 nm, respectively.

In one embodiment of the present invention, an angle θ2 formed between an absorption axis of the polarizer and the slow axis of the retardation film satisfies the below-indicated expression (3):

$$38° \leq \theta2 \leq 52° \tag{3}$$

In one embodiment of the present invention, a clearance between the wiring crimping portion and the circularly polarizing plate is 7 mm or less.

In one embodiment of the present invention, the display element includes an organic EL panel.

According to another aspect of the present invention, there is provided a method of manufacturing a display apparatus. The method includes: securing a wiring crimping portion along at least one side of a peripheral edge portion of a display element, followed by bonding of a circularly polarizing plate including a polarizer and a retardation film to the display element; crimping the display element and a wiring under heat in the wiring crimping portion to connect the display element and the wiring; and washing a region including the wiring crimping portion and an end portion of the circularly polarizing plate on a wiring crimping portion side with a solvent. In the method, in-plane retardations of the retardation film satisfy a relationship represented by the below-indicated expression (1); and an angle θ1 formed between a slow axis of the retardation film and a direction in which the wiring crimping portion extends satisfies a relationship represented by the below-indicated expression (2):

$$Re(450) < Re(550) \tag{1}$$

$$\theta1 \leq 70° \tag{2}$$

Where Re(450) and Re(550) represent in-plane retardations measured at 23° C., and at wavelengths of 450 nm and 550 nm, respectively.

In one embodiment of the present invention, the circularly polarizing plate is free of occurrence of a crack in the crimping and the washing with the solvent.

Advantageous Effects of Invention

According to one embodiment of the present invention, the angle formed between the slow axis of the retardation film of the circularly polarizing plate and the direction in which the wiring crimping portion provided along at least one side of the peripheral edge portion of the display element extends is controlled to a predetermined angle or less, and a film having the so-called reverse wavelength dispersion dependency is used as the retardation film, and hence the occurrence of a crack in the retardation film in the crimping of the wiring and the washing with the solvent after the crimping can be satisfactorily suppressed. According to the one embodiment of the present invention, such effect can be realized even when the clearance between the wiring crimping portion and the circularly polarizing plate is small. Accordingly, even when a non-display portion is reduced in size to correspond to, for example, a requirement in terms of design, the occurrence of the crack can be suppressed. Further, according to the one embodiment of the present invention, the manufacturing efficiency of the display apparatus can be maintained because neither an additional operation nor a complicated operation is needed for the suppression of the occurrence of the crack.

DESCRIPTION OF EMBODIMENTS

Hereinafter, preferred embodiments of the present invention are described. However, the present invention is not limited to these embodiments.

DEFINITIONS OF TERMS AND SYMBOLS

The definitions of terms and symbols used herein are as follows.
(1) Refractive Indices (Nx, Ny, and Nz)

A symbol "nx" represents a refractive index in a direction in which an in-plane refractive index is maximum (that is, slow axis direction), "ny" represents a refractive index in a direction perpendicular to the slow axis in the plane (that is, fast axis direction), and "nz" represents a refractive index in a thickness direction.
(2) In-Plane Retardation (Re)

The term "Re(550)" refers to the in-plane retardation of a film measured at 23° C. with light having a wavelength of 550 nm. The Re(550) is determined from the equation "Re=(nx−ny)×d" when the thickness of the film is represented by d (nm). It should be noted that the term "Re(450)" refers to the in-plane retardation of the film measured at 23° C. with light having a wavelength of 450 nm.
(3) Thickness Direction Retardation (Rth)

The term "Rth(550)" refers to the thickness direction retardation of the film measured at 23° C. with light having a wavelength of 550 nm. The Rth(550) is determined from the equation "Rth=(nx−nz)×d" when the thickness of the film is represented by d (nm). It should be noted that the term "Rth(450)" refers to the thickness direction retardation of the film measured at 23° C. with light having a wavelength of 450 nm.
(4) Nz Coefficient An Nz coefficient is determined from the equation "Nz=Rth/Re".

Hereinafter, specific embodiments of the present invention is described with reference to the drawings, but the present invention is not limited to these embodiments. It should be noted that the drawings are schematic views for improving visibility, and their scales in longitudinal, lateral, and thickness directions are different from actual ones.

A. Entire Construction of Display Apparatus

Figure 1:
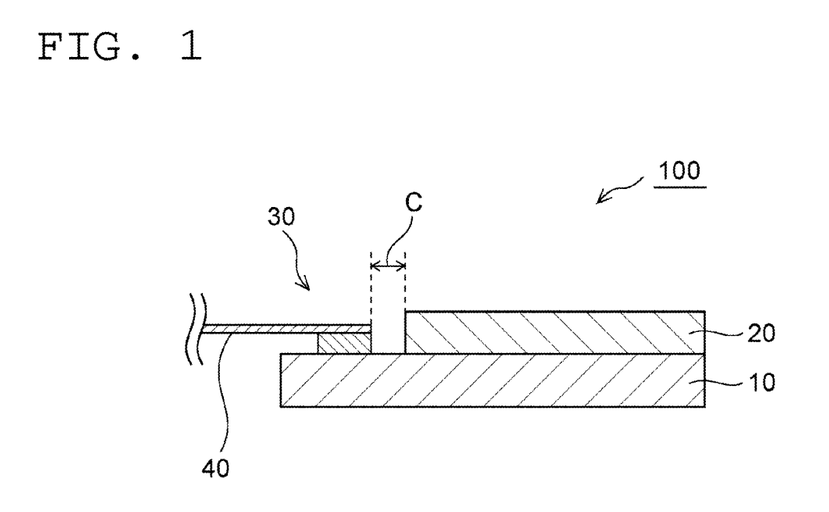
FIG. 1 is a schematic sectional view of a display apparatus according to one embodiment of the present invention.
Figure 2A:
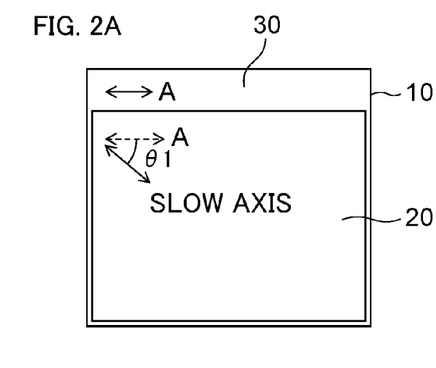
FIGS. 2A to 2E are each a schematic plan view illustrating a typical form of a wiring crimping portion to be provided in the display apparatus.
Figure 2B:
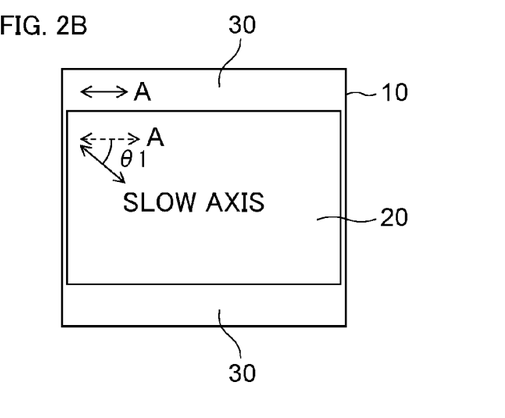
Figure 2C:
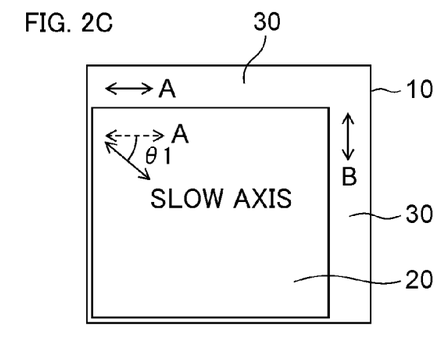
Figure 2D:
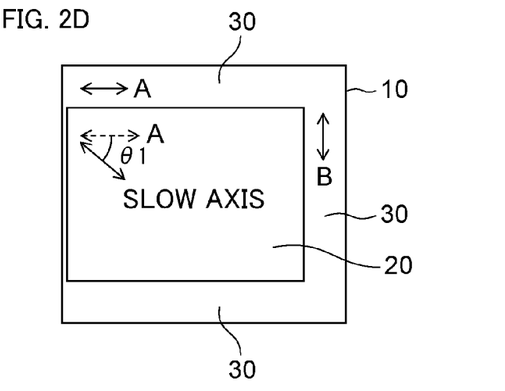
Figure 2E:
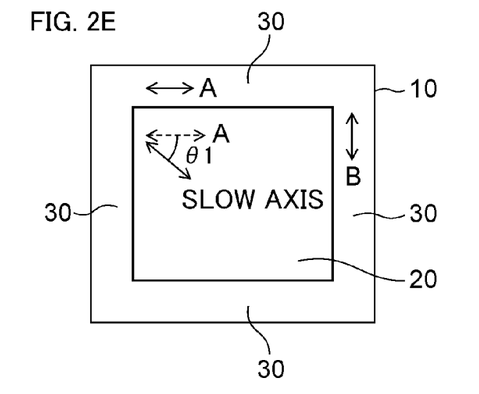

FIG. 1 is a schematic sectional view of a display apparatus according to one embodiment of the present invention, and FIGS. 2A to 2E are each a schematic plan view illustrating a typical form of a wiring crimping portion to be provided in the display apparatus. A display apparatus 100 illustrated in FIG. 1 includes an organic EL panel 10 and a circularly polarizing plate 20 placed on the viewer side of the organic EL panel 10. The display apparatus 100 is provided with a wiring crimping portion 30 and is connected to a drive circuit substrate (not shown) by, for example, a flexible cable 40 crimped onto the wiring crimping portion 30. The wiring crimping portion 30 is provided in a non-display portion. More specifically, the wiring crimping portion 30 is provided along at least one side of the peripheral edge portion of the organic EL panel 100. For example, the wiring crimping portion 30 may be provided along one of the sides of the peripheral edge portion of the organic EL panel as illustrated in FIG. 2A, may be provided along two sides thereof opposite to each other as illustrated in FIG. 2B, may be provided along two sides thereof adjacent to each other as illustrated in FIG. 2C, may be provided along three sides thereof as illustrated in FIG. 2D, or may be provided along the entirety (four sides) of the peripheral edge portion as illustrated in FIG. 2E. Although FIGS. 1 and 2A to 2E each illustrate the case where a display element is the organic EL panel, a display element in the present invention is not limited to the organic EL panel, and any appropriate display element (such as a liquid crystal panel or a plasma display panel) that can provide the effects of the present invention (typically such a display element that a step of crimping a wiring is included in its manufacture) can be adopted.

The circularly polarizing plate 20 includes a polarizer and a retardation film (a detailed construction of the circularly polarizing plate is described in the section C to be described later). The in-plane retardations of the retardation film satisfy a relationship represented by the following expression (1).

$$Re(450) < Re(550) \qquad (1)$$

Satisfying such relationship can achieve an excellent reflection hue in the front direction of the organic EL panel. Further, according to the retardation film having such relationship, the crack-suppressing effect resulting from the specification of an angle θ1 to be described later is significant.

The angle θ1 formed between the slow axis of the retardation film and the direction in which the wiring crimping portion extends satisfies a relationship represented by the following expression (2).

$$\theta1 \leq 70° \qquad (2)$$

Satisfying such relationship can satisfactorily suppress the occurrence of a crack in the retardation film in the crimping of the wiring and washing with a solvent after the crimping. In the case where the wiring crimping portion is provided along one of the sides of the peripheral edge portion of the display element or along two sides thereof opposite to each other (e.g., such a case as illustrated in FIG. 2A or FIG. 2B), the angle θ1 is preferably 50° or less, more preferably 30° or less, still more preferably 10° or less, particularly preferably about 0° (i.e., the direction of the slow axis and the direction of an arrow A are substantially parallel to each other). In the case where the wiring crimping portion is provided along two sides of the peripheral edge portion of the display element adjacent to each other, or along three or more sides thereof (e.g., such a case as illustrated in any one of FIG. 2C to FIG. 2E), the angle θ1 is preferably from 30° to 60°, more preferably from 40° to 50°, still more preferably from 42° to 48°, particularly preferably about 45°. When the angle θ1 is set as described above, the angle θ1 can be caused to fall within the desired range for each of the wiring crimping portion extending in the direction of the arrow A and the wiring crimping portion extending in the direction of an arrow B. As a result, the occurrence of a crack can be suppressed for: the crimping of the wiring, and the washing with the solvent after the crimping, in the wiring crimping portion extending in the direction of the arrow A; and the crimping of the wiring, and the washing with the solvent after the crimping, in the wiring crimping portion extending in the direction of the arrow B. It should be noted that in each of FIG. 2C to FIG. 2E, the θ1 is represented as the angle of the slow axis with respect to the direction of the arrow A for simplicity. Needless to say, however, the θ1 may be represented as an angle with respect to the direction of the arrow B. In addition, when reference is made to an angle in the description, the angle comprehends angles in both a clockwise direction and a counterclockwise direction unless otherwise stated.

A clearance between the wiring crimping portion 30 and the circularly polarizing plate 20 (a distance C between the end portion of the wiring crimping portion on a circularly polarizing plate side and the end portion of the circularly polarizing plate on a wiring crimping portion side in FIG. 1) is preferably 7 mm or less, more preferably 3.5 mm or less, still more preferably 2 mm or less. According to an embodiment of the present invention, even when the non-display portion is reduced in size to correspond to, for example, a requirement in terms of design and hence the clearance becomes small as described above, the occurrence of a crack in the retardation film of the circularly polarizing plate can be satisfactorily suppressed.

B. Organic EL Panel

Figure 3:
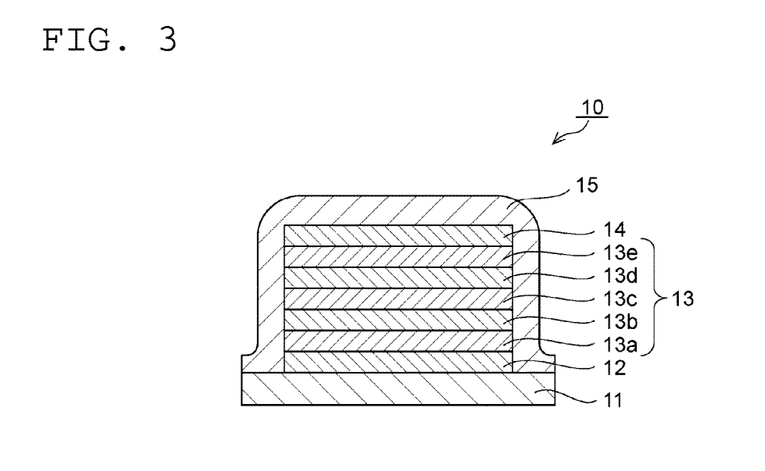
FIG. 3 is a schematic sectional view illustrating one form of an organic EL panel to be used in the present invention.

Any appropriate organic EL panel can be adopted as the organic EL panel 10 as long as the effects of the present invention are obtained. FIG. 3 is a schematic sectional view illustrating one form of the organic EL panel to be used in the present invention. The organic EL panel 10 typically includes a substrate 11, a first electrode 12, an organic EL layer 13, a second electrode 14, and a sealing layer 15 for covering these components. The organic EL panel 10 can further include any appropriate layer as required. For example, a planarizing layer (not shown) may be provided on the substrate, or an insulating layer (not shown) for preventing a short circuit may be provided between the first electrode and the second electrode.

The substrate 11 can be constituted of any appropriate material as long as the effects of the present invention are obtained. The substrate 11 is typically constituted of a material having barrier property. Such substrate can protect the organic EL layer 13 from oxygen and moisture. Specific examples of the material having barrier property include glass, an alloy, and a metal. Examples of the alloy include stainless steel, a 36 alloy, and a 42 alloy. Examples of the metal include copper, nickel, iron, aluminum, and titanium. The substrate has a thickness of preferably from 5 μm to 500 μm, more preferably from 5 μm to 200 μm, still more preferably from 10 μm to 300 μm.

The first electrode 12 can typically function as an anode. In this case, a material constituting the first electrode is preferably a material having a large work function from the viewpoint of facilitating the injection of a hole. Specific examples of such material include: transparent conductive materials such as indium tin oxide (ITO), indium zinc oxide (IZO), indium tin oxide to which silicon oxide has been added (ITSO), indium oxide containing tungsten oxide (IWO), indium zinc oxide containing tungsten oxide (IWZO), indium oxide containing titanium oxide (ITiO), indium tin oxide containing titanium oxide (ITTiO), and indium tin oxide containing molybdenum (ITMO); and metals such as gold, silver, and platinum, and alloys thereof.

The organic EL layer 13 is a laminate including various organic thin films. In the illustrated example, the organic EL layer 13 includes: a hole-injecting layer 13a formed of a hole injectable organic material (such as a triphenylamine derivative), and formed so as to improve the hole injection efficiency from an anode; a hole-transporting layer 13b formed of, for example, copper phthalocyanine; a light-emitting layer 13c formed of a luminous organic substance (such as anthracene, bis[N-(1-naphthyl)-N-phenyl]benzidine, or N,N'-diphenyl-N—N-bis(1-naphthyl)-1,1'-(biphenyl)-4,4'-diamine (NPB)); an electron-transporting layer 13d formed of, for example, an 8-quinolinol aluminum complex; and an electron-injecting layer 13e formed of an electron injectable material (such as a perylene derivative or lithium fluoride), and formed so as to improve the electron injection efficiency from a cathode. The organic EL layer 13 is not limited to the illustrated example, and any appropriate combination that can cause light emission through the recombination of an electron and a hole in the light-emitting layer 13c can be adopted. The thickness of the organic EL layer 13 is preferably as small as possible. This is because the layer preferably transmits the emitted light to the extent possible. The organic EL layer 13 can be constituted of an extremely thin laminate having a thickness of, for example, from 5 nm to 200 nm, preferably about 10 nm.

The second electrode 14 can typically function as a cathode. In this case, a material constituting the second electrode is preferably a material having a small work function from the viewpoint of facilitating the injection of an electron to improve luminous efficiency. Specific examples of such material include aluminum, magnesium, and alloys thereof.

The sealing layer 15 is constituted of any appropriate material. The sealing layer 15 is preferably constituted of a material excellent in barrier property and transparency. Typical examples of the material constituting the sealing layer include an epoxy resin and polyurea. In one embodiment, the sealing layer 15 may be formed by applying the epoxy resin (typically an epoxy resin adhesive) and bonding a barrier sheet onto the resin.

The organic EL panel 10 can be produced by a method typically adopted in the art.

C. Circularly Polarizing Plate

Figure 4:
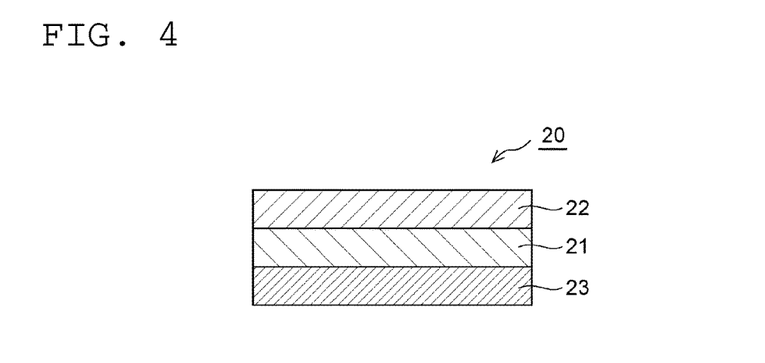
FIG. 4 is a schematic sectional view illustrating one form of a circularly polarizing plate to be used in the present invention.

Any appropriate circularly polarizing plate can be adopted as the circularly polarizing plate 20 as long as the effects of the present invention are obtained. FIG. 4 is a schematic sectional view illustrating one form of the circularly polarizing plate to be used in the present invention. The circularly polarizing plate 20 includes a polarizer 21, a protective film 22 placed on one side of the polarizer 21, and a retardation film 23 placed on the other side of the polarizer 21. The protective film 22 may be omitted depending on purposes. Meanwhile, another protective film (hereinafter sometimes referred to as "inner protective film": not shown) may be placed between the polarizer 21 and the retardation film 23 as required.

As described above, the in-plane retardations of the retardation film 23 satisfy a relationship of Re(450)<Re (550). That is, the retardation film shows the so-called reverse wavelength dispersion dependency. The refractive index characteristics of the retardation film 23 show a relationship of nx>ny, and the film has a slow axis. The polarizer 21 and the retardation film 23 are laminated so that the absorption axis of the polarizer 21 and the slow axis of the retardation film 23 may form a predetermined angle. An angle θ2 formed between the absorption axis of the polarizer 21 and the slow axis of the retardation film 23 preferably satisfies the following expression (3).

$$38° \leq θ2 \leq 52° \tag{3}$$

The angle θ2 is more preferably from 39° to 51°, still more preferably from 42° to 48°.

The entire thickness of the circularly polarizing plate, which varies depending on its construction, is typically from about 40 μm to 300 μm. The circularly polarizing plate can be produced by a method typically adopted in the art. Each layer constituting the circularly polarizing plate is described below.

C-1. Polarizer

Any appropriate polarizer may be adopted as the polarizer. Specific examples thereof include: a product obtained by subjecting a hydrophilic polymer film such as a polyvinyl alcohol-based film, a partially formalized polyvinyl alcohol-based film, or an ethylene-vinyl acetate copolymer-based partially saponified film to dyeing treatment with a dichromatic substance such as iodine or a dichromatic dye and stretching treatment; and a polyene-based alignment film such as a dehydration-treated product of polyvinyl alcohol or a dehydrochlorination-treated product of polyvinyl chloride. Of those, a polarizer obtained by dyeing a polyvinyl alcohol-based film with iodine and uniaxially stretching the resultant is preferably used because of its excellent optical characteristics.

The dyeing with iodine is performed by, for example, immersing the polyvinyl alcohol-based film in an aqueous solution of iodine. The stretching ratio of the uniaxial stretching is preferably from 3 to 7 times. The stretching may be performed after the dyeing treatment or may be performed simultaneously with the dyeing. In addition, the stretching may be performed before the dyeing. The polyvinyl alcohol-based film is subjected to, for example, swelling treatment, cross-linking treatment, washing treatment, or drying treatment as required. For example, when the polyvinyl alcohol-based film is washed with water by being immersed in water before the dyeing, the soil or antiblocking agent on the surface of the polyvinyl alcohol-based film can be washed off. In addition, the polyvinyl alcohol-based film can be swollen to prevent dyeing unevenness or the like.

The thickness of the polarizer is typically from about 1 μm to 80 μm.

C-2. Retardation Film

As described above, the refractive index characteristics of the retardation film show a relationship of nx>ny. The in-plane retardation Re(550) of the retardation film is preferably from 100 nm to 180 nm, more preferably from 135 nm to 155 nm.

As described above, the retardation film shows the so-called reverse wavelength dispersion dependency. Specifically, its in-plane retardations satisfy a relationship of Re(450)<Re(550). A ratio "Re(450)/Re(550)" is preferably 0.8 or more and less than 1.0, more preferably from 0.8 to 0.95. The use of the retardation film showing the reverse wavelength dispersion dependency can satisfactorily suppress the occurrence of a crack in the crimping of the wiring and the washing with the solvent after the crimping.

The retardation film shows any appropriate refractive index ellipsoid as long as the film has the relationship of nx>ny. The refractive index ellipsoid of the retardation film preferably shows a relationship of nx>ny≥nz. The Nz coefficient of the retardation film is preferably from 1 to 2, more preferably from 1 to 1.5, still more preferably from 1 to 1.3.

The retardation film is formed of any appropriate resin capable of satisfying such optical characteristics as described above. Examples of the resin for forming the retardation film include a polycarbonate resin, a polyvinyl acetal resin, a cycloolefin-based resin, an acrylic resin, and a cellulose ester-based resin. Of those, a polycarbonate resin is preferred because its effect of suppressing crack occurrence is significant. The resins for forming the retardation film may be used alone or in combination depending on desired characteristics.

In one embodiment, the polycarbonate resin contains a dihydroxy compound having a fluorene structure (fluorene-based dihydroxy compound). Of such compounds, a compound represented by the below-indicated formula (1) having the structure of 9,9-diphenylfluorene is preferred from the viewpoints of the heat resistance, mechanical strength, optical characteristics of the polycarbonate resin to be obtained, and polymerization reactivity.

In the general formula (1), $R^1$ to $R^4$ each independently represent a hydrogen atom, a substituted or unsubstituted alkyl group having 1 to 20 carbon atoms, a substituted or unsubstituted cycloalkyl group having 6 to 20 carbon atoms, or a substituted or unsubstituted aryl group having 6 to 20 carbon atoms, and represent groups identical to or different from each other as the four respective substituents present in the benzene rings. X represents a substituted or unsubstituted alkylene group having 2 to 10 carbon atoms, a substituted or unsubstituted cycloalkylene group having 6 to 20 carbon atoms, or a substituted or unsubstituted arylene group having 6 to 20 carbon atoms. m and n each independently represent an integer of from 0 to 5.

$R^1$ to $R^4$ each independently represent preferably a hydrogen atom or an alkyl group having 1 to 6 carbon atoms and being unsubstituted or substituted with an ester group, an ether group, a carboxylic acid, an amide group, or a halogen, more preferably a hydrogen atom or an alkyl group having 1 to 6 carbon atoms. X represents preferably an alkylene group having 2 to 10 carbon atoms and being unsubstituted or substituted with an ester group, an ether group, a carboxylic acid, an amide group, or a halogen, a cycloalkylene group having 6 to 20 carbon atoms and being unsubstituted or substituted with an ester group, an ether group, carboxylic acid, an amide group, or a halogen, or an arylene group having 6 to 20 carbon atoms and being unsubstituted or substituted with an ester group, an ether group, a carboxylic acid, an amide group, or a halogen, more preferably an alkylene group having 2 to 6 carbon atoms. In addition, m and n each independently preferably represent an integer of from 0 to 2. Of those integers, 0 or 1 is preferred.

Specific examples of the compound include 9,9-bis[4-(2-hydroxyethoxyl)phenyl]fluorene, 9,9-bis(4-hydroxyphenyl) fluorene, 9,9-bis(4-hydroxy-2-methylphenyl)fluorene, 9,9-bis(4-hydroxy-3-methylphenyl)fluorene, 9,9-bis[4-(2-hydroxypropoxyl)phenyl]fluorene, 9,9-bis(4-(2-hydroxyethoxyl)phenyl)fluorene, 9,9-bis[4-(2-hydroxyethoxy)-3-methylphenyl]fluorene, 9,9-bis[4-(2-hydroxypropoxy)-3-methylphenyl]fluorene, 9,9-bis[4-(2-hydroxyethoxy)-3-isopropylphenyl]fluorene, 9,9-bis[4-(2-hydroxyethoxy)-3-isobutylphenyl]fluorene, 9,9-bis[4-(2-hydroxyethoxy)-3-tert-butylphenyl]fluorene, 9,9-bis[4-(2-hydroxyethoxy)-3-cyclohexylphenyl]fluorene, 9,9-bis[4-(2-hydroxyethoxy)-3-phenylphenyl]fluorene, 9,9-bis[4-(2-hydroxyethoxy)-3,5-dimethylphenyl]fluorene, 9,9-bis[4-(2-hydroxyethoxy)-3-tert-butyl-6-methylphenyl]fluorene, and 9,9-bis[4-(3-hydroxy-2,2-dimethylpropoxy)phenyl]fluorene.

Of those, 9,9-bis(4-hydroxy-3-methylphenyl) fluorene, 9,9-bis(4-(2-hydroxyethoxyl)phenyl)fluorene, or 9,9-bis(4-(2-hydroxyethoxy)-3-methylphenyl) fluorene is preferred from the viewpoints of expression of optical performances, handleability, easy availability, and the like, 9,9-bis(4-hydroxy-3-methylphenyl) fluorene is preferably used when heat resistance is required, and 9,9-bis(4-(2-hydroxyethoxyl)phenyl)fluorene is preferably used when the toughness of the film is required.

The polycarbonate resin is preferably a resin obtained by using 10 mol % or more of the fluorene-based dihydroxy compound having a structural unit represented by the general formula (1) as a raw material monomer with respect to all dihydroxy compounds, and the usage is more preferably 20 mol % or more, particularly preferably 25 mol % or more. In addition, the usage is preferably 90 mol % or less, more preferably 70 mol % or less, particularly preferably 50 mol % or less. When the usage of the monomer having such structural unit is excessively small, the resultant polycarbonate resin may not show desired optical performance. When the usage is excessively large, the melt viscosity of the resultant polycarbonate resin becomes so high that its productivity or formability tends to reduce.

The polycarbonate resin preferably contains a structural unit derived from a dihydroxy compound except the fluorene-based dihydroxy compound (sometimes referred to as "other dihydroxy compound") in order that its optical properties may be regulated to desired ones.

Examples of the other dihydroxy compound include a dihydroxy compound of a linear aliphatic hydrocarbon, a dihydroxy compound of a linear branched aliphatic hydrocarbon, a dihydroxy compound of an alicyclic hydrocarbon, and an aromatic bisphenol.

Examples of the dihydroxy compound of a linear aliphatic hydrocarbon include ethylene glycol, 1,3-propanediol, 1,2-propanediol, 1,4-butanediol, 1,3-butanediol, 1,2-butanediol, 1,5-heptanediol, 1,6-hexanediol, 1,10-decanediol, and 1,12-dodecanediol. In particular, a dihydroxy compound of a linear aliphatic hydrocarbon that has 3 to 6 carbons and that has hydroxy groups at both the terminals, such as 1,3-propanediol, 1,4-butanediol, 1,5-heptanediol, or 1,6-hexanediol, is preferred.

Examples of the dihydroxy compound of a linear branched aliphatic hydrocarbon may include neopentyl glycol and 2-ethylhexylene glycol.

Examples of the dihydroxy compound of an alicyclic hydrocarbon include 1,2-cyclohexanediol, 1,2-cyclohexanedimethanol, 1,3-cyclohexanedimethanol, 1,4-cyclohexanedimethanol, tricyclodecanedimethanol, pentacyclopentadecanedimethanol, 2,6-decalindimethanol, 1,5-decalindimethanol, 2,3-decalindimethanol, 2,3-norbornanedimethanol, 2,5-norbornanedimethanol, 1,3-adamantanedimethanol, and a dihydroxy compound derived from a terpene compound such as limonene. In particular, 1,2-cyclohexanedimethanol, 1,3-cyclohexanedimethanol, 1,4-cyclohexanedimethanol, or tricyclodecanedimethanol is preferred, and a dihydroxy compound having a cyclohexane structure such as 1,2-cyclohexanedimethanol, 1,3-cyclohexanedimethanol, or 1,4-cyclohexanedimethanol is more preferred.

Examples of the aromatic bisphenol include 2,2-bis(4-hydroxyphenyl)propane, 2,2-bis(4-hydroxy-3,5-dimethylphenyl)propane, 2,2-bis(4-hydroxy-3,5-diethylphenyl)propane, 2,2-bis(4-hydroxy-(3,5-diphenyl)phenyl)propane, 2,2-bis(4-hydroxy-3,5-dibromophenyl)propane, 2,2-bis(4-hydroxyphenyl)pentane, 2,4'-dihydroxy-diphenylmethane, bis(4-hydroxyphenyl)methane, bis(4-hydroxy-5-nitrophenyl)methane, 1,1-bis(4-hydroxyphenyl)ethane, 3,3-bis(4-hydroxyphenyl)pentane, 1,1-bis(4-hydroxyphenyl)cyclohexane, bis(4-hydroxyphenyl) sulfone, 2,4'-dihydroxydiphenyl sulfone, bis(4-hydroxyphenyl) sulfide, 4,4'-dihydroxydiphenyl ether, and 4,4'-dihydroxy-3,3'-dichlorodiphenyl ether. Of those, 2,2-bis(4-hydroxyphenyl)propane (=bisphenol A) is preferred from the viewpoints of easy availability and impartation of heat resistance.

At least one kind of dihydroxy compound having a moiety represented by the below-indicated formula (2) in part of its structure is preferably used as the other dihydroxy compound from the viewpoint of imparting, for example, an optical characteristic such as a moderate birefringent index or a low photoelastic coefficient, toughness, a mechanical strength, or adhesion to the retardation film to be obtained.

(2)

Specific examples thereof include an oxyalkylene glycol, a dihydroxy compound having an ether group bonded to an aromatic group in its main chain, and a dihydroxy compound having a cyclic ether structure.

Examples of the oxyalkylene glycol include diethylene glycol, triethylene glycol, tetraethylene glycol, polyethylene glycol, and polypropylene glycol. Of those, polyethylene glycol having a number-average molecular weight of from 150 to 2,000 is preferred.

Examples of the dihydroxy compound having an ether group bonded to an aromatic group in its main chain include 2,2-bis[4-(2-hydroxyethoxyl)phenyl]propane, 2,2-bis[4-(2-hydroxypropoxyl)phenyl]propane, 1,3-bis(2-hydroxyethoxy)benzene, 4,4'-bis(2-hydroxyethoxy)biphenyl, and bis[4-(2-hydroxyethoxyl)phenyl]sulfone.

Examples of the dihydroxy compound having a cyclic ether structure include dihydroxy compounds represented by the below-indicated formulae (3) to (5).

It should be noted that the "cyclic ether structure" of the "dihydroxy compound having a cyclic ether structure" means a structure in which the cyclic structure has an ether group in itself and carbon constituting its cyclic chain is aliphatic carbon.

(3)

(4)

(5)

Examples of the dihydroxy compound represented by the formula (3) include isosorbide, isomannide, and isoidide that are in a stereoisomer relationship. They may be used alone or in combination.

Of those dihydroxy compounds each having a cyclic ether structure, a dihydroxy compound having two cyclic ether structures such as the dihydroxy compound represented by the formula (3) or spiroglycol represented by the below-indicated formula (4) is more preferred from the viewpoint of imparting heat resistance.

When the dihydroxy compounds/compound represented by the formula (3), the formula (4), and/or the formula (5) are each/is used as a raw material monomer, the usage is preferably 10 mol % or more, more preferably 30 mol % or more, particularly preferably 40 mol % or more with respect to all dihydroxy compounds. In addition, an upper limit for the usage is preferably 90 mol % or less, more preferably 80 mol % or less, particularly preferably 60 mol % or less. When the usage of the dihydroxy compound is excessively small or excessively large, the resultant polycarbonate resin may not show desired optical performance.

One kind of the other dihydroxy compounds may be used in combination with the fluorene-based dihydroxy compound, or a combination of two or more kinds thereof may be used in combination therewith depending on performance required of the polycarbonate resin to be obtained. In particular, two or more kinds of the other dihydroxy compounds are preferably copolymerized in addition to the fluorene-based dihydroxy compound in order that there may be obtained a polycarbonate resin that expresses desired optical performance, can be stably produced, and has characteristics suited to the retardation film.

The polycarbonate resin can be obtained by causing the fluorene-based dihydroxy compound, and as required, the other dihydroxy compound, and phosgene to react with each other. The polycarbonate resin can be preferably obtained by: blowing phosgene into a solution formed of an alkaline solution of those dihydroxy compounds and methylene chloride to provide an oligomer; then increasing its molecular weight to a predetermined value with a catalyst such as triethylamine or a terminal stopper such as a monohydroxy compound as required; and then isolating the polycarbonate resin dissolved in a methylene chloride phase. In addition, as another method, the polycarbonate resin can be obtained by subjecting the dihydroxy compounds and a carbonic diester as raw materials to polycondensation through an ester exchange reaction.

The carbonic diester to be used is typically, for example, a diester represented by the below-indicated formula (6). Such carbonic diesters may be used alone or as a mixture.

(6)

In the formula (6), $A^1$ and $A^2$ each represent a substituted or unsubstituted aliphatic hydrocarbon group having 1 to 18 carbon atoms, or a substituted or unsubstituted aromatic hydrocarbon group, and $A^1$ and $A^2$ may be identical to or different from each other. $A^1$ and $A^2$ each represent preferably a substituted or unsubstituted aromatic hydrocarbon group, more preferably an unsubstituted aromatic hydrocarbon group.

Examples of the carbonic diester represented by the formula (6) include diphenyl carbonate (DPC), substituted diphenyl carbonate such as ditolyl carbonate, dimethyl carbonate, diethyl carbonate, and di-t-butyl carbonate. Of those, diphenyl carbonate or substituted diphenyl carbonate is preferred, and diphenyl carbonate is particularly preferred.

It should be noted that the carbonic diester may contain an impurity such as a chloride ion, and the impurity may inhibit the polymerization reaction or deteriorate the hue of the polycarbonate resin to be obtained. Accordingly, the carbonic diester is preferably purified by distillation or the like as required before use.

In addition, part of the carbonic diester may be substituted with a dicarboxylic acid or an ester thereof (hereinafter referred to as "dicarboxylic acid compound"). Used as such dicarboxylic acid compound is, for example, a dicarboxylic acid such as terephthalic acid, isophthalic acid, oxalic acid, succinic acid, or 1,4-cyclohexanedicarboxylic acid, or a methyl ester or phenyl ester thereof. When part of the carbonic diester is substituted with the dicarboxylic acid compound, the polycarbonate resin is sometimes referred to as "polyester carbonate resin". The content of a structural unit derived from the dicarboxylic acid compound in the polycarbonate resin to be used in the present invention is preferably 45 mol % or less, more preferably 40 mol % or less with respect to structural units derived from all dihydroxy compounds and all carboxylic acid compounds. When the content of the dicarboxylic acid compound is more than 45 mol %, polymerizability reduces and hence the polymerization does not progress to a desired molecular weight in some cases.

In another embodiment, a resin described in JP 3325560 B2 may be used as the polycarbonate resin.

The glass transition temperature of the polycarbonate resin is preferably 110° C. or more and 150° C. or less, more preferably 120° C. or more and 140° C. or less. When the glass transition temperature is excessively low, the heat resistance of the resin tends to deteriorate and hence the resin may cause a dimensional change after its forming into a film. In addition, the image quality of an organic EL panel to be obtained may reduce. When the glass transition temperature is excessively high, the forming stability of the resin at the time of its forming into a film may deteriorate. In addition, the transparency of the film may be impaired. It should be noted that the glass transition temperature is determined in conformity with JIS K 7121 (1987).

The molecular weight of the polycarbonate resin can be represented by a reduced viscosity. The reduced viscosity is measured as follows: a solution of the resin is prepared by using methylene chloride as a solvent while precisely adjusting a polycarbonate concentration to 0.6 g/dL, and the reduced viscosity of the solution is measured with an Ubbelohde viscosity tube at a temperature of 20.0° C.±0.1° C. In ordinary cases, a lower limit for the reduced viscosity is preferably 0.30 dL/g, more preferably 0.35 dL/g or more. In ordinary cases, an upper limit for the reduced viscosity is preferably 1.20 dL/g, more preferably 1.00 dL/g, still more preferably 0.80 dL/g. When the reduced viscosity is less than the lower limit, a problem in that the mechanical strength of a formed article reduces may arise. On the other hand, when the reduced viscosity is more than the upper limit, a problem in that the flowability of the resin upon its forming reduces, and hence productivity or formability reduces may arise.

Any appropriate polyvinyl acetal resin can be used as the polyvinyl acetal resin. The polyvinyl acetal resin can be typically obtained by subjecting at least two kinds of aldehyde compounds and/or ketone compounds, and a polyvinyl alcohol-based resin to a condensation reaction. Specific examples of the polyvinyl acetal resin and a detailed production method therefor are described in, for example, JP 2007-161994 A. The description is incorporated herein by reference.

The retardation film is typically produced by stretching a resin film in at least one direction.

Any appropriate method may be adopted as a method of forming the resin film. Examples thereof include a melt extrusion method (such as a T die forming method), a cast coating method (such as a casting method), a calender forming method, a hot press method, a co-extrusion method, a co-melting method, multilayer extrusion, and an inflation forming method. Of those, a T die forming method, a casting method, and an inflation molding method are preferably used.

The thickness of the resin film (unstretched film) may be set to any appropriate value depending on, for example, desired optical characteristics and stretching conditions to be described later. The thickness is preferably from 50 µm to 300 µm, more preferably from 80 µm to 250 µm.

Any appropriate stretching method and stretching conditions (such as a stretching temperature, a stretching ratio, and a stretching direction) may be adopted for the stretching. Specifically, one kind of various stretching methods such as free-end stretching, fixed-end stretching, free-end shrinkage, and fixed-end shrinkage may be employed alone, or two or more kinds thereof may be employed simultaneously or sequentially. With regard to the stretching direction, the stretching may be performed in various directions or dimensions such as a horizontal direction, a vertical direction, a thickness direction, and a diagonal direction. When the glass transition temperature of the resin film is represented by Tg, the stretching temperature ranges preferably from Tg-20° C. to Tg+20° C.

A retardation film having the desired optical characteristics (such as a refractive index ellipsoid, an in-plane retardation, and an Nz coefficient) can be obtained by appropriately selecting the stretching method and stretching conditions.

In one embodiment, the retardation film is produced by subjecting the resin film to uniaxial stretching or fixed-end uniaxial stretching. The fixed-end uniaxial stretching is, for example, a method involving stretching the resin film in its widthwise direction (lateral direction) while running the film in its lengthwise direction. The stretching ratio is preferably from 10% to 500%.

In another embodiment, the retardation film is produced by obliquely stretching a resin film having a long shape in a direction at the angle θ with respect to its lengthwise direction in a continuous manner. Adopting the oblique stretching provides a stretched film having a long shape with an alignment angle of the angle θ with respect to the lengthwise direction of the film, enables a roll-to-roll process upon, for example, its lamination with the polarizer, and can simplify a production process.

A stretching machine to be used in the oblique stretching is, for example, a tenter-type stretching machine capable of applying a feeding force or tensile force, or take-up force having different speeds on left and right sides in a lateral direction and/or a longitudinal direction. Although the tenter-type stretching machine comes in, for example, a lateral uniaxial stretching machine and a simultaneous biaxial stretching machine, any appropriate stretching machine may be used as long as the machine can obliquely stretch the resin film having a long shape in a continuous manner.

As a method for the oblique stretching, there are given, for example, methods described in JP 50-83482 A, JP 02-113920 A, JP 03-182701 A, JP 2000-9912 A, JP 2002-86554 A, JP 2002-22944 A, and the like.

The retardation film (stretched film) has a thickness of preferably from 20 µm to 100 µm, more preferably from 30 µm to 80 µm.

As the retardation film, a commercial film may be used as it is, or a commercial film may be subjected to secondary processing (such as stretching treatment or surface treatment) before use depending on purposes. A specific example of the commercial film is a product available under the trade name "PURE-ACE WR" from TEIJIN LIMITED.

The surface of the retardation film 23 on the polarizer 21 side may be subjected to surface treatment. Examples of the surface treatment include corona treatment, plasma treatment, flame treatment, primer application treatment, and saponification treatment. The corona treatment is, for example, a system involving performing discharge with a corona treatment machine in normal-pressure air. The plasma treatment is, for example, a system involving performing discharge with a plasma discharger in normal-pressure air. The flame treatment is, for example, a system involving bringing a flame into direct contact with the surface of the film. The primer application treatment is, for example, a system involving: diluting an isocyanate compound, a silane coupling agent, and the like with a solvent; and applying the diluted liquid in a thin manner. The saponification treatment is, for example, a system involving immersing the film in an aqueous solution of sodium hydroxide. Of those, the corona treatment or the plasma treatment is preferred.

C-3. Protective Film

The protective film 22 is formed of any appropriate film that may be used as a protective layer for the polarizer. Specific examples of a material serving as a main component of the film include transparent resins such as a cellulose-based resin such as triacetylcellulose (TAC), a polyester-based resin, a polyvinyl alcohol-based resin, a polycarbonate-based resin, a polyamide-based resin, a polyimide-based resin, a polyether sulfone-based resin, a polysulfone-based resin, a polystyrene-based resin, a polynorbornene-based resin, a polyolefin-based resin, a (meth) acrylic resin, and an acetate-based resin. Another example thereof is a thermosetting resin or a UV-curable resin such as a (meth)acrylic resin, a urethane-based resin, a (meth) acrylic urethane-based resin, an epoxy-based resin, or a silicone-based resin. Still another example thereof is a glassy polymer such as a siloxane-based polymer. Further, a polymer film described in JP 2001-343529 A (WO 01/37007 A1) may also be used. As a material for the film, for example, there may be used a resin composition containing a thermoplastic resin having a substituted or unsubstituted imide group in a side chain and a thermoplastic resin having a substituted or unsubstituted phenyl group and a nitrile group in a side chain. An example thereof is a resin composition containing an alternate copolymer formed of isobutene and N-methylmaleimide and an acrylonitrile-styrene copolymer. The polymer film may be an extruded product of the resin composition, for example.

The glass transition temperature (Tg) of the (meth)acrylic resin is preferably 115° C. or more, more preferably 120° C. or more, still more preferably 125° C. or more, particularly preferably 130° C. or more because excellent durability can be obtained. An upper limit for the Tg of the (meth)acrylic resin is not particularly limited, and is preferably 170° C. or less from the viewpoint of formability or the like.

Any appropriate (meth)acrylic resin may be adopted as the (meth)acrylic resin as long as the effects of the present invention are not impaired. Examples of the (meth)acrylic resin include poly(meth)acrylates such as polymethyl methacrylate, a methyl methacrylate-(meth)acrylic acid copolymer, a methyl methacrylate-(meth)acrylate copolymer, a methyl methacrylate-acrylate-(meth)acrylic acid copolymer, a methyl(meth)acrylate-styrene copolymer (such as an MS resin), and a polymer having an alicyclic hydrocarbon group (such as a methyl metharylate-cyclohexyl methacrylate copolymer or a methyl methacrylate-norbornyl(meth)acrylate copolymer). Preferred examples thereof include poly ($C_{1-6}$ alkyl(meth)acrylates) such as polymethyl(meth)acrylate. A more preferred example thereof is a methyl methacrylate-based resin containing methyl methacrylate as a main component (from 50 to 100 wt %, preferably from 70 to 100 wt %).

Specific examples of the (meth)acrylic resin include ACRYPET VH and ACRYPET VRL20A manufactured by Mitsubishi Rayon Co., Ltd., a (meth)acrylic resin having a ring structure in the molecule described in JP 2004-70296 A, and a (meth)acrylic resin with a high Tg obtained by intramolecular cross-linking or an intramolecular cyclization reaction.

The (meth)acrylic resin is particularly preferably a (meth) acrylic resin having a lactone ring structure because of having high heat resistance, high transparency, and high mechanical strength.

Examples of the (meth)acrylic resin having a lactone ring structure include (meth)acrylic resins each having a lactone ring structure described in JP 2000-230016 A, JP 2001-151814 A, JP 2002-120326 A, JP 2002-254544 A, and JP 2005-146084 A.

The mass-average molecular weight (sometimes referred to as weight-average molecular weight) of the (meth)acrylic resin having a lactone ring structure is preferably from 1,000 to 2,000,000, more preferably from 5,000 to 1,000,000, still more preferably from 10,000 to 500,000, particularly preferably from 50,000 to 500,000.

The glass transition temperature (Tg) of the (meth)acrylic resin having a lactone ring structure is preferably 115° C. or more, more preferably 125° C. or more, still more preferably 130° C. or more, particularly preferably 135° C. or more, most preferably 140° C. or more because excellent durability can be obtained. An upper limit value for the Tg of the (meth)acrylic resin having a lactone ring structure is not particularly limited, and is preferably 170° C. or less from the viewpoint of formability or the like.

It should be noted that the term "(meth)acrylic" as used herein refers to acrylic and/or methacrylic.

The surface of the protective film 22 on a side opposite to the polarizer may be subjected to surface treatment such as hard coat treatment, antireflection treatment, antisticking treatment, or antiglare treatment as required. The thickness of the protective film is typically 5 mm or less, preferably 1 mm or less, more preferably from 1 µm to 500 µm, still more preferably from 5 µm to 150 µm.

When the inner protective film (not shown) is provided, the inner protective film is preferably optically isotropic. The phrase "optically isotropic" as used herein means that the in-plane retardation Re(550) is from 0 nm to 10 nm, and the thickness direction retardation Rth(550) is from −10 nm to +10 nm.

The thickness of the inner protective film is preferably from 20 µm to 200 µm, more preferably from 30 µm to 100 µm, still more preferably from 35 µm to 95 µm.

C-4. Easy-Adhesion Layer

In one embodiment, the surface of the retardation film 23 on the polarizer 21 side may be provided with an easy-adhesion layer (not shown). When the easy-adhesion layer is provided, the retardation film may be subjected to the surface treatment or may not be subjected thereto. The retardation film is preferably subjected to the surface treatment. The combination of the easy-adhesion layer and the surface treatment can accelerate the realization of a desired adhesive strength between the polarizer 21 and the retardation film 23. The easy-adhesion layer preferably contains a silane having a reactive functional group. Providing such easy-adhesion layer can accelerate the realization of the desired adhesive strength between the polarizer 21 and the retardation film 23. Details about the easy-adhesion layer are described in, for example, JP 2006-171707 A.

C-5. Others

Any appropriate pressure-sensitive adhesive layer or adhesive layer is used in the lamination of the respective layers constituting the circularly polarizing plate 20. The pressure-sensitive adhesive layer is typically formed of an acrylic pressure-sensitive adhesive. The adhesive layer is typically formed of a polyvinyl alcohol-based adhesive. As described above, when the light-diffusing layer is constituted of a light-diffusing pressure-sensitive adhesive or a light-diffusing adhesive, a pressure-sensitive adhesive layer or adhesive layer for laminating the polarizer and the retardation film can be omitted.

D. Method of Manufacturing Display Apparatus

Hereinafter, an example of a method of manufacturing a display apparatus of the present invention is described. The manufacturing method includes: securing a wiring crimping portion along at least one side of the peripheral edge portion of a display element, followed by the bonding of a circularly polarizing plate to the display element (step 1); crimping the display element and a wiring under heat in the wiring crimping portion to connect the display element and the wiring (step 2); and washing a region including the wiring crimping portion and an end portion of the circularly polarizing plate on a wiring crimping portion side with a solvent (step 3).

D-1. Step 1

First, the wiring crimping portion is secured along at least one side of the peripheral edge portion of the display element (such as an organic EL panel). As described in the section A with reference to FIGS. 2A to 2E, the wiring crimping portion may be secured along one of the sides of the peripheral edge portion, may be secured along two sides thereof opposite to each other, may be secured along two sides thereof adjacent to each other, may be secured along three sides thereof, or may be secured along the entirety (four sides) of the peripheral edge portion. After (the region of) the wiring crimping portion has been secured as described above, the circularly polarizing plate is bonded to the display element. The bonding of the circularly polarizing plate is performed by any appropriate means (through, for example, any appropriate pressure-sensitive adhesive). A clearance between the circularly polarizing plate and the wiring crimping portion to be provided upon bonding of the circularly polarizing plate is as described in the section A. The circularly polarizing plate is bonded to the display element so that an angle θ1 formed between the slow axis of the retardation film of the circularly polarizing plate and the direction in which the wiring crimping portion extends may satisfy a relationship of θ1≤70°. Such bonding satisfactorily suppresses the occurrence of a crack in the retardation film in the below-indicated steps 2 and 3 (typically, substantially no crack occurs). Further, as described in the sections A and C, the retardation film of the circularly polarizing plate has a relationship of Re(450)<Re(550) and hence shows the so-called reverse wavelength dispersion dependency. The crack-suppressing effect is significant in such retardation film.

D-2. Step 2

Next, in the wiring crimping portion, the display element and the wiring (such as a flexible cable) are crimped under heat, and the display element and a drive circuit substrate are connected to each other through the wiring. The crimping can be performed with any appropriate thermal pressing machine. For example, a heating temperature at the time of the crimping is from 130° C. to 230° C., a crimping time is from 5 seconds to 25 seconds, and a pressure at the time of the crimping is from 1 MPa to 5 MPa.

D-3. Step 3

Next, dirt and/or a burnt deposit at the time of the crimping under heat are/is removed by washing the region including the wiring crimping portion and the end portion of the circularly polarizing plate on the wiring crimping portion side with the solvent. More specifically, the washing can be performed by wiping the region with a waste impregnated with the solvent. Any appropriate solvent can be used as the solvent as long as the solvent has high volatility, has a washing effect, and exhibits small influences on the display element and the circularly polarizing plate. Specific examples of the solvent include ethyl acetate, methyl ethyl ketone (MEK), tetrahydrofuran (THF), acetone, toluene, and a mixture thereof.

D-4. Other Step

Detailed description of any other step in the method of manufacturing a display element of the present invention is omitted because a method, operation, and means typically adopted in the art are adopted.

EXAMPLES

Hereinafter, the present invention is specifically described by way of Examples. However, the present invention is not limited by Examples below. Methods of measuring the respective characteristics are as described below. It should be noted that the terms "part(s)" and "%" in Examples and Comparative Examples refer to "part(s) by weight" and "wt %", respectively unless otherwise stated.

(1) Thickness

Measurement was performed with a dial gauge (manufactured by PEACOCK, product name "DG-205 type pds-2").

(2) Retardation

Measurement was performed with an Axoscan manufactured by Axometrics. Measurement wavelengths were 450 nm and 550 nm, and a measurement temperature was 23° C. It should be noted that a film piece measuring 50 mm by 50 mm cut out of a retardation film was used as a measurement sample.

(3) Evaluation for Crack

A flexible substrate was crimped onto the wiring portion of an organic EL panel obtained in each of Examples and Comparative Examples under heat through an anisotropic conductive film. After that, a wiring crimping portion and an end portion of a circularly polarizing plate on a wiring crimping portion side were wiped with a waste impregnated with ethyl acetate. The presence or absence of the occurrence of a crack in the retardation film due to the operation was observed visually or with a microscope. It should be noted that the crimping under heat was performed with a thermal pressing machine (AD-50S5C-A manufactured by ADVANCEL Co., Ltd.). A heating temperature was 200° C. and a crimping time was 10 seconds.

Example 1

Production of Polarizer

An elongated polyvinyl alcohol film was dyed in an aqueous solution containing iodine. After that, the film was uniaxially stretched at a stretching ratio of 6 times in an aqueous solution containing boric acid between rolls having different speed ratios to provide an elongated polarizer having an absorption axis in its lengthwise direction. After the stretching, the elongated polarizer was wound to provide a roll body.

(Protective Film)

An elongated triacetylcellulose film (thickness: 40 μm, manufactured by KONICA MINOLTA, INC., trade name: KC4UYW) was used as a protective film. The protective film was prepared as a roll body. It should be noted that the protective film had an in-plane retardation Re(550) of 5 nm and a thickness direction retardation Rth(550) of 45 nm.

(Retardation Film)

A commercial retardation film showing reverse wavelength dispersion dependency (manufactured by TEIJIN LIMITED, trade name "PURE-ACE WR") was used. The retardation film had an in-plane retardation Re(550) of 147 nm and a ratio Re(450)/Re(550) of 0.89.

(Production of Circularly Polarizing Plate)

The polarizer, the protective film, and the retardation film were each cut into a piece measuring 50 mm by 50 mm. The polarizer and the protective film were bonded to each other through a polyvinyl alcohol-based adhesive. Further, the laminate of the polarizer and the protective film, and the retardation film were bonded to each other through an acrylic pressure-sensitive adhesive layer so that the polarizer and the retardation film were adjacent to each other. Thus, a circularly polarizing plate having a construction of protective film/polarizer/retardation film was produced. It should be noted that the retardation film was cut so that its slow axis and the absorption axis of the polarizer formed an angle of 45° upon its bonding.

(Production of Organic EL Panel)

An organic EL panel was removed from an organic EL display (manufactured by LG, product name: "15EL9500"), and a polarizing plate bonded to the organic EL panel was peeled therefrom. Then, the obtained circularly polarizing plate was bonded thereto instead of the peeled polarizing plate. Thus, an organic EL panel with a circularly polarizing plate was obtained. The circularly polarizing plate was bonded so that the slow axis of the retardation film and the direction in which the wiring crimping portion of the organic EL panel extended formed an angle of 70°. In addition, a clearance between the wiring crimping portion and the end surface of the circularly polarizing plate at this time was 1.7 mm. The resultant organic EL panel was subjected to the evaluation for a crack described in the (3). As a result, the occurrence of a crack was not observed. Table 1 shows the result.

Example 2

Production of Polycarbonate Resin Film 37.5 Parts by mass of isosorbide (ISB), 91.5 parts by mass of 9,9-[4-(2-hydroxyethoxyl)phenyl]fluorene (BHEPF), 8.4 parts by mass of polyethylene glycol (PEG) having an average molecular weight of 400, 105.7 parts by mass of diphenyl carbonate (DPC), and 0.594 part by mass of cesium carbonate (0.2 mass % aqueous solution) as a catalyst were loaded into a reaction vessel. Under a nitrogen atmosphere, as the first-stage of a reaction, the heating medium temperature of the reaction vessel was set to 150° C., and the raw materials were dissolved (for about 15 minutes) while being stirred as required.

Next, a pressure in the reaction vessel was changed from normal pressure to 13.3 kPa, and produced phenol was extracted to the outside of the reaction vessel while the heating medium temperature of the reaction vessel was increased to 190° C. within 1 hour. After the temperature in the reaction vessel had been held at 190° C. for 15 minutes, as the second-stage, the pressure in the reaction vessel was set to 6.67 kPa, the heating medium temperature of the reaction vessel was increased to 230° C. within 15 minutes, and produced phenol was extracted to the outside of the reaction vessel. Thus, the stirring torque of a stirring machine started to increase. Accordingly, the temperature was increased to 250° C. within 8 minutes, and in order for produced phenol to be removed, the pressure in the reaction vessel was reduced to 0.200 kPa or less. After the stirring torque had reached a predetermined value, the reaction was terminated, and a produced reaction product was extruded into water and then pelletized. Thus, a polycarbonate resin A containing 42.9 mol % of BHEPF, 52.8 mol % of ISB, and 4.3 mol % of PEG was obtained. The resultant polycarbonate resin A had a glass transition temperature of 126° C. and a reduced viscosity of 0.372 dL/g.

The resultant polycarbonate resin A was dried in a vacuum at 80° C. for 5 hours. After that, a polycarbonate resin film having a length of 3 m, a width of 300 mm, and a thickness of 120 μm was produced from the resin by using a film-producing apparatus provided with a uniaxial extruder (manufactured by Isuzu Kakoki, screw diameter: 25 mm, cylinder preset temperature: 220° C.), a T-die (width: 300 mm, preset temperature: 220° C.), a chill roll (preset temperature: 120 to 130° C.), and a winding machine.

(Production of Retardation Film)

The resultant resin film was cut into a piece measuring 300 mm long by 300 mm wide, and the piece was longitudinally stretched with a Lab Stretcher KARO IV (manufactured by Bruckner) at a temperature of 136° C. and a ratio of twice to provide a retardation film. The resultant retardation film had an in-plane retardation Re(550) of 141 nm, a thickness direction retardation Rth(550) of 141 nm, and a ratio Re(450)/Re(550) of 0.89.

(Production of Organic EL Panel)

A circularly polarizing plate having a construction of protective film/polarizer/retardation film was produced in the same manner as in Example 1 except that the retardation film obtained in the foregoing was used. Further, an organic EL panel was produced in the same manner as in Example 1 except that: the resultant circularly polarizing plate was used; and the circularly polarizing plate was bonded so that the slow axis of the retardation film and the direction in which the wiring crimping portion of the organic EL panel extended formed an angle of 45°. The resultant organic EL panel was subjected to the evaluation for a crack described in the (3). As a result, the occurrence of a crack was not observed. Table 1 shows the result.

Example 3

An organic EL panel was produced in the same manner as in Example 2 except that the circularly polarizing plate was bonded so that the slow axis of the retardation film and the direction in which the wiring crimping portion of the organic EL panel extended formed an angle of 0°. The resultant organic EL panel was subjected to the evaluation for a crack described in the (3). As a result, the occurrence of a crack was not observed. Table 1 shows the result.

Comparative Example 1

An organic EL panel was produced in the same manner as in Example 1 except that the circularly polarizing plate was bonded so that the slow axis of the retardation film and the direction in which the wiring crimping portion of the organic EL panel extended formed an angle of 75°. The resultant organic EL panel was subjected to the evaluation for a crack described in the (3). As a result, several cracks occurred in the retardation film. Table 1 shows the result.

Comparative Example 2

A cycloolefin-based resin film showing a flat wavelength dispersion characteristic (manufactured by OPTES INC., ZEONOR FILM ZF-14, thickness: 100 μm) was longitudinally and uniaxially stretched with a Lab Stretcher (KARO IV manufactured by Bruckner) at a stretching temperature of 135° C. and a stretching ratio of twice to provide a retardation film. The resultant retardation film had an in-plane retardation Re(550) of 147 nm and a ratio Re(450)/Re(550) of 1.00. A circularly polarizing plate having a construction of protective film/polarizer/retardation film was produced in the same manner as in Example 1 except that the retardation film was used. Further, an organic EL panel was produced in the same manner as in Example 2 except that the resultant circularly polarizing plate was used. The resultant organic EL panel was subjected to the evaluation for a crack described in the (3). As a result, many cracks occurred in the retardation film.

TABLE 1

|  | Re(450)/Re(550) | Angle θ1 (°) | Crack |
|---|---|---|---|
| Example 1 | 0.89 | 70 | None |
| Example 2 | 0.89 | 45 | None |
| Example 3 | 0.89 | 0 | None |
| Comparative Example 1 | 0.89 | 75 | Several cracks occurred |
| Comparative Example 2 | 1.00 | 45 | Many cracks occurred |

Angle θ1: An angle formed between the slow axis of the retardation film and the direction in which the wiring crimping portion of the organic EL panel extends

[Evaluation]

As is apparent from Table 1, in each of Examples of the present invention in which the retardation film having reverse wavelength dispersion dependency was used, and the angle θ1 formed between the slow axis of the retardation film of the circularly polarizing plate and the direction in which the wiring crimping portion of the organic EL panel extended was set to the predetermined angle or less, the occurrence of a crack was able to be prevented in the crimping under heat and the washing with the solvent after the crimping. In each of Comparative Example 1 in which the angle θ1 was larger than the predetermined angle and Comparative Example 2 in which the so-called flat-dispersion retardation film was used, a crack occurred in the crimping under heat and the washing with the solvent after the crimping.

INDUSTRIAL APPLICABILITY

The display apparatus of the present invention can be suitably utilized in, for example, a smart device such as a smart phone, a digital signage, or a window display.

REFERENCE SIGNS LIST 10 display element
20 circularly polarizing plate
21 polarizer
22 protective film
23 retardation film
30 wiring crimping portion
100 display apparatus

The invention claimed is:

1. A display apparatus, comprising:
a display element;
a wiring crimping portion provided along at least one side of a peripheral edge portion of the display element; and
a circularly polarizing plate placed on a viewer side of the display element,
wherein:
the circularly polarizing plate includes a polarizer and a retardation film;
in-plane retardations of the retardation film satisfy a relationship represented by the below-indicated expression (1); and
an angle θ1 formed between a slow axis of the retardation film and a direction in which the wiring crimping portion provided along the at least one side of the peripheral edge portion of the display element extends satisfies a relationship represented by the below-indicated expression (2), with respect to the wiring crimping portion provided along any side of the peripheral edge portions:

$Re(450) < Re(550)$ (1)

$θ1 \leq 70°$ (2)

where $Re(450)$ and $Re(550)$ represent in-plane retardations measured at 23° C., and at wavelengths of 450 nm and 550 nm, respectively.

2. A display apparatus according to claim 1, wherein an angle θ2 formed between an absorption axis of the polarizer and the slow axis of the retardation film satisfies the below-indicated expression (3):

$38° \leq θ2 \leq 52°$ (3).

3. A display apparatus according to claim 1, wherein a clearance between the wiring crimping portion and the circularly polarizing plate is 7 mm or less.

4. A display apparatus according to claim 1, wherein the display element comprises an organic EL panel.

5. A method of manufacturing a display apparatus, comprising:
securing a wiring crimping portion along at least one side of a peripheral edge portion of a display element, followed by bonding of a circularly polarizing plate including a polarizer and a retardation film to the display element;
crimping the display element and a wiring under heat in the wiring crimping portion to connect the display element and the wiring; and
washing a region including the wiring crimping portion and an end portion of the circularly polarizing plate on a wiring crimping portion side with a solvent,
wherein:
in-plane retardations of the retardation film satisfy a relationship represented by the below-indicated expression (1); and
an angle θ1 formed between a slow axis of the retardation film and a direction in which the wiring crimping portion extends satisfies a relationship represented by the below-indicated expression (2):

$Re(450) < Re(550)$ (1)

$θ1 \leq 70°$ (2)

where $Re(450)$ and $Re(550)$ represent in-plane retardations measured at 23° C., and at wavelengths of 450 nm and 550 nm, respectively.

6. A method of manufacturing a display apparatus according to claim 5, wherein the circularly polarizing plate is free of occurrence of a crack in the crimping and the washing with the solvent.

* * * * *